(12) United States Patent
Kishimoto et al.

(10) Patent No.: US 11,430,940 B2
(45) Date of Patent: Aug. 30, 2022

(54) MULTILAYER PIEZOELECTRIC ELEMENT, PIEZOELECTRIC VIBRATION APPARATUS, AND ELECTRONIC DEVICE

(71) Applicant: TAIYO YUDEN CO., LTD., Tokyo (JP)

(72) Inventors: Sumiaki Kishimoto, Takasaki (JP);
Hiroshi Hamada, Takasaki (JP);
Hiroyuki Shimizu, Takasaki (JP);
Yukihiro Matsui, Takasaki (JP);
Tomohiro Harada, Takasaki (JP);
Yukihiro Konishi, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 1084 days.

(21) Appl. No.: 16/034,236

(22) Filed: Jul. 12, 2018

(65) Prior Publication Data

US 2019/0027678 A1 Jan. 24, 2019

(30) Foreign Application Priority Data

Jul. 18, 2017 (JP) .............................. JP2017-139413
Mar. 13, 2018 (JP) .............................. JP2018-045560

(51) Int. Cl.
*H01L 41/187* (2006.01)
*H01L 41/293* (2013.01)
(Continued)

(52) U.S. Cl.
CPC .......... *H01L 41/187* (2013.01); *H01L 41/083* (2013.01); *H01L 41/0973* (2013.01);
(Continued)

(58) Field of Classification Search
CPC .... H01L 41/187; H01L 41/293; H01L 41/083
See application file for complete search history.

(56) References Cited

U.S. PATENT DOCUMENTS

| 2014/0116766 A1* | 5/2014 | Jeon | H05K 3/3442 |
| | | | 361/321.2 |
| 2014/0339960 A1* | 11/2014 | Kadota | H03H 9/177 |
| | | | 310/357 |

(Continued)

FOREIGN PATENT DOCUMENTS

| JP | 2016100760 A | 5/2016 |
| WO | 2016052582 A1 | 4/2016 |

*Primary Examiner* — Bryan P Gordon
(74) *Attorney, Agent, or Firm* — Law Office of Katsuhiro Arai (57) ABSTRACT

A multilayer piezoelectric element includes a ceramic base body, a pair of external electrodes, multiple internal electrodes, and surface electrodes. The pair of external electrodes cover a pair of end faces and extend from the pair of end faces along a pair of principal faces and a pair of side faces. The multiple internal electrodes are stacked inside the ceramic base body along the thickness direction, and are connected alternately to one or the other of the pair of external electrodes along the thickness direction. The surface electrodes extend from the pair of external electrodes along the pair of principal faces, and are each divided in the longitudinal direction at a position near, of the pair of external electrodes, the external electrode to which the internal electrode adjacent to the principal face is connected.

15 Claims, 7 Drawing Sheets

(51) Int. Cl.
*H04R 17/00* (2006.01)
*H01L 41/083* (2006.01)
*H01L 41/09* (2006.01)
H01L 41/27 (2013.01)
H01L 41/053 (2006.01)
H04R 7/04 (2006.01)
H01L 41/273 (2013.01)

(52) U.S. Cl.
CPC ........... *H01L 41/293* (2013.01); *H04R 17/00* (2013.01); H01L 41/053 (2013.01); H01L 41/27 (2013.01); H01L 41/273 (2013.01); H04R 7/045 (2013.01); H04R 2440/05 (2013.01); H04R 2499/15 (2013.01)

(56) References Cited

U.S. PATENT DOCUMENTS

| | | | |
|---|---|---|---|
| 2016/0056366 A1* | 2/2016 | Nakamura | H01L 41/083 29/25.35 |
| 2016/0365502 A1* | 12/2016 | Saito | H01L 41/0471 |
| 2017/0311086 A1* | 10/2017 | Ishii | H04R 7/045 |
| 2017/0313625 A1* | 11/2017 | Sumi | H01L 41/187 |

* cited by examiner

MULTILAYER PIEZOELECTRIC ELEMENT, PIEZOELECTRIC VIBRATION APPARATUS, AND ELECTRONIC DEVICE

BACKGROUND

Field of the Invention

The present invention relates to a multilayer piezoelectric element, a piezoelectric vibration apparatus, and an electronic device, in which the transverse piezoelectric effect is utilized.

Description of the Related Art

Giving a multilayer piezoelectric element a long and thin shape whose dimension in the direction crossing at right angles with the stacking direction is greater, allows for effective utilization of the transverse piezoelectric effect. Such multilayer piezoelectric element can be caused to contract greatly in the longitudinal direction, by applying voltage between the external electrodes provided at both of its end parts in the longitudinal direction (refer to Patent Literature 1, for example).

BACKGROUND ART LITERATURES

[Patent Literature 1] Japanese Patent Laid-open No. 2016-100760
[Patent Literature 2] International Patent Laid-open No. 2016/052582

SUMMARY

However, shaping a multilayer piezoelectric element long and thin makes it easy for the element to receive strong impact, especially at both end parts in the longitudinal direction, during mounting, etc. This makes such multilayer piezoelectric element vulnerable to damage at both end parts in the longitudinal direction. This gives rise to a need for an art that can reduce damage suffered by a multilayer piezoelectric element at both end parts in the longitudinal direction.

In light of the aforementioned situation, an object of the present invention is to provide a multilayer piezoelectric element, a piezoelectric vibration apparatus, and an electronic device, which can reduce damage.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the multilayer piezoelectric element pertaining to a mode of the present invention comprises a ceramic base body, a pair of external electrodes, multiple internal electrodes, and surface electrodes.

The ceramic base body is formed by a piezoelectric ceramic, and has a pair of end faces that are facing each other in a longitudinal direction, a pair of principal faces that are facing each other in a thickness direction crossing at right angles with the longitudinal direction, and a pair of side faces that are facing each other in a width direction crossing at right angles with the longitudinal direction and the thickness direction.

The pair of external electrodes cover the pair of end faces and extend from the pair of end faces along the pair of principal faces and the pair of side faces.

The multiple internal electrodes are stacked inside the ceramic base body along the thickness direction, and connected alternately to the pair of external electrodes along the thickness direction.

The surface electrodes extend from the pair of external electrodes along the pair of principal faces, and are each divided in the longitudinal direction at a position near the external electrode to which the internal electrode adjacent in the thickness direction is connected.

According to this constitution, the pair of external electrodes extend onto the pair of principal faces and the pair of side faces, and cover both end parts of the multilayer piezoelectric element in the longitudinal direction. This way, both end parts of the multilayer piezoelectric element are protected by the pair of external electrodes and thus become less vulnerable to damage. Accordingly, damage of this multilayer piezoelectric element can be reduced.

Rounded-off faces may be formed along the ridge parts of the pair of external electrodes.

The radii of curvature of the rounded faces may be 10 μm or greater.

According to these constitutions, chipping, cracking, etc., of the ridge parts of the pair of external electrodes can be reduced.

Angled faces tapering inward in the thickness direction toward the pair of end faces may be provided at both end parts of the pair of principal faces in the longitudinal direction.

The pair of external electrodes may cover parts of the angled faces.

According to this constitution, groove parts are formed in areas of the angled faces not covered by the pair of external electrodes. As a result, the adhesive enters the groove parts when the multilayer piezoelectric element is adhered to the mounting surface of a vibration plate, etc. This improves the adhesion of the multilayer piezoelectric element to the mounting surface.

The piezoelectric vibration apparatus pertaining to a mode of the present invention comprises the aforementioned multilayer piezoelectric element, a vibration plate, and an adhesive layer.

The vibration plate faces the multilayer piezoelectric element in the thickness direction.

The adhesive layer is placed between the multilayer piezoelectric element and the vibration plate.

The electronic device pertaining to a mode of the present invention comprises the aforementioned multilayer piezoelectric element, a panel, and a housing.

The panel has the multilayer piezoelectric element adhered to it in a manner facing the panel in the thickness direction.

The housing retains the panel.

According to the present invention, a multilayer piezoelectric element, a piezoelectric vibration apparatus, and an electronic device, which can reduce damage, can be provided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

10—Multilayer piezoelectric element
11—Ceramic base body
11a, 11b—End face
11c, 11d—Side face
11e, 11f—Principal face
12, 13—Internal electrode
14, 15—External electrode
16, 17—Surface electrode
16a, 17a—Function part
16b, 17b—Dummy part
18—Ceramic layer
20—Piezoelectric vibration apparatus
21—Vibration plate
22—Adhesive layer
30—Electronic device
31—Housing
32—Panel

DETAILED DESCRIPTION OF EMBODIMENTS

An embodiment of the present invention is explained below by referring to the drawings. In the drawings, the X-axis, Y-axis, and Z-axis, crossing at right angles with one another, are shown as deemed appropriate. The X-axis, Y-axis, and Z-axis are the same in all drawings.

[Constitution of Multilayer Piezoelectric Element 10]

Figure 1:
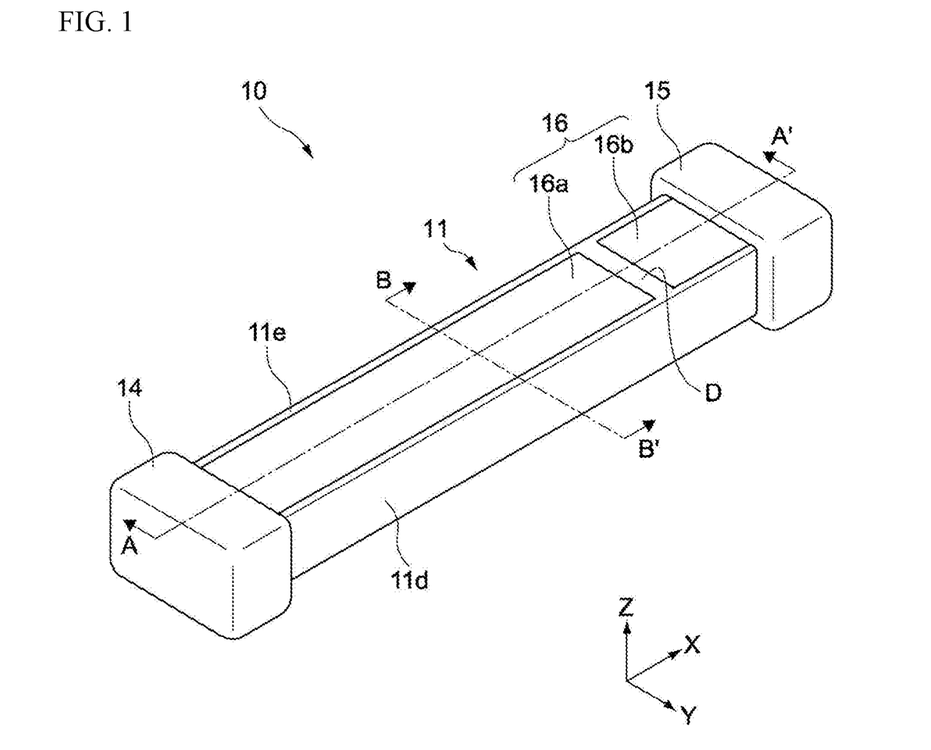
FIG. 1 is a perspective view of the multilayer piezoelectric element pertaining to an embodiment of the present invention.
Figure 2:
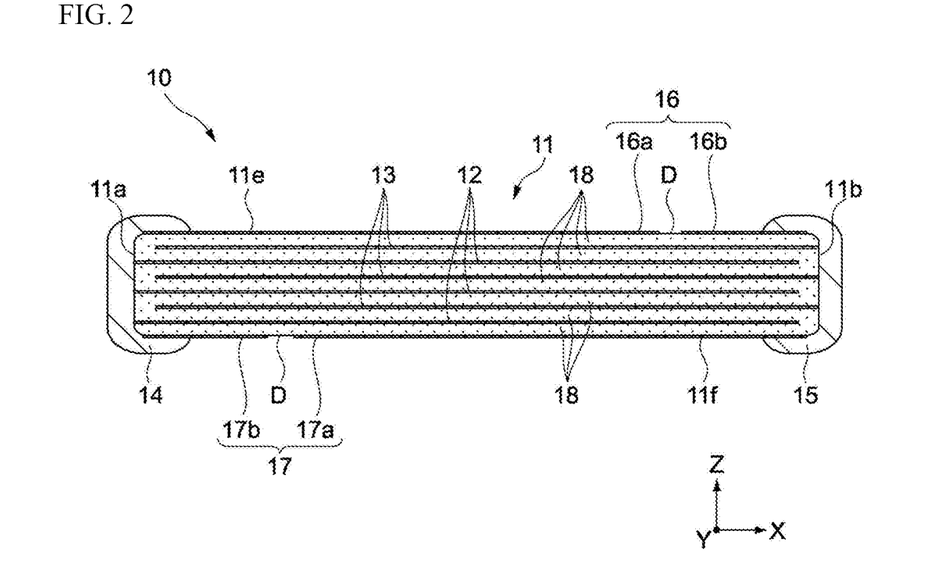
FIG. 2 is a cross-sectional view of the multilayer piezoelectric element along line A-A' in FIG. 1.
Figure 3:
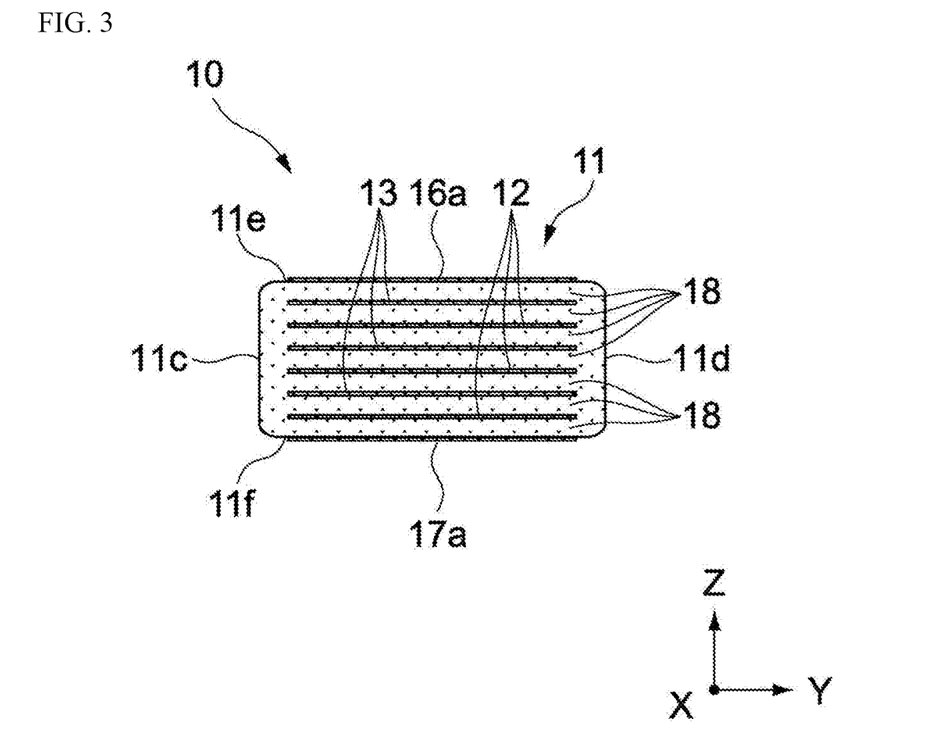
FIG. 3 is a cross-sectional view of the multilayer piezoelectric element along line B-B' in FIG. 1

FIGS. 1 to 3 are drawings providing schematic representations of the constitution of the multilayer piezoelectric element 10 pertaining to an embodiment of the present invention. FIG. 1 is a perspective view of the multilayer piezoelectric element 10. FIG. 2 is a cross-sectional view of the multilayer piezoelectric element 10 along line A-A' in FIG. 1. FIG. 3 is a cross-sectional view of the multilayer piezoelectric element 10 along line B-B' in FIG. 1.

The multilayer piezoelectric element 10 has a longitudinal direction along the X-axis, a width direction along the Y-axis, and a thickness direction along the Z-axis. In other words, the multilayer piezoelectric element 10 is formed elongated in the X-axis direction. This means that, in the case of the multilayer piezoelectric element 10, deformation in the X-axis direction due to the transverse piezoelectric effect is more dominant than deformation in the Z-axis direction due to the longitudinal piezoelectric effect.

The multilayer piezoelectric element 10 comprises a ceramic base body 11, a first external electrode 14, and a second external electrode 15. The ceramic base body 11 has first and second end faces 11a, 11b facing the X-axis direction, first and second side faces 11c, 11d facing the Y-axis direction, and first and second principal faces 11e, 11f facing the Z-axis direction.

It should be noted that the shape of the ceramic base body 11 is not limited to a rectangular solid as shown in FIGS. 1 to 3. For example, the ridge parts connecting the respective faces of the ceramic base body 11 may be chamfered. Also, each face of the ceramic base body 11 may be a curved face, and the ceramic base body 11 may have a rounded shape as a whole.

The first external electrode 14 covers the first end face 11a of the ceramic base body 11 and extends from the first end face 11a along the side faces 11c, 11d and the principal faces 11e, 11f. The second external electrode 15 covers the second end face 11b of the ceramic base body 11 and extends from the second end face 11b along the side faces 11c, 11d and the principal faces 11e, 11f.

Round faces constituting gradual curved faces are formed on the exterior faces of the external electrodes 14, 15 along the bent ridge parts. Preferably the radii of curvature of the rounded faces along the ridge parts of the external electrodes 14, 15 are 10 μm or greater. This makes the ridge parts of the external electrodes 14, 15 less prone to receiving concentrated stress applied externally, and therefore chipping, cracking, etc., can be reduced.

The external electrodes 14, 15 are formed by a good electrical conductor. Good electrical conductors by which to form the external electrodes 14, 15 include metals such as copper (Cu), nickel (Ni), tin (Sn), palladium (Pd), platinum (Pt), silver (Ag), gold (Au), etc., or alloys whose primary component is any of the foregoing, for example.

The ceramic base body 11 is formed by a piezoelectric ceramic whose absolute value of piezoelectric constant $d_{31}$ is large. Lead-free materials include materials based on lithium niobate ($LiNbO_3$) and lithium tantalate ($LiTaO_3$), for example. Lead materials include materials based on lead zirconate titanate ($PbZrO_3$—$PbTiO_3$), for example.

First internal electrodes 12 and second internal electrodes 13 are provided inside the ceramic base body 11. Both internal electrodes 12, 13 are sheet-shaped and extend along the XY plane, and are placed alternately along the Z-axis direction with spacing between them. In other words, the internal electrodes 12, 13 are covered by the piezoelectric ceramic.

This means that ceramic layers 18, which are layers of the piezoelectric ceramic, are formed between the internal electrodes 12, 13. The first internal electrodes 12 are led out to the first end face 11a of the ceramic base body 11, and connected to the first external electrode 14. The second internal electrodes 13 are led out to the second end face 11b of the ceramic base body 11, and connected to the second external electrode 15.

As shown in FIG. 3, the internal electrodes 12, 13 are placed with spacing between them and the side faces 11c, 11d. In other words, a side margin part that forms a space is provided in the ceramic base body 11 between the internal electrodes 12, 13 and the side faces 11c, 11d. This ensures insulation property of the internal electrodes 12, 13 at the side faces 11c, 11d.

The ceramic base body 11 has a first surface electrode 16 provided on the first principal face 11e, and a second surface electrode 17 provided on the second principal face 11f. As a result, a ceramic layer 18 is also formed between the top second internal electrode 13 in the Z-axis direction and the first surface electrode 16, and between the bottom first internal electrode 12 in the Z-axis direction and the second surface electrode 17.

The first surface electrode 16 is divided, by a gap D formed at a position between its center part in the X-axis direction and the second external electrode 15, into a first function part 16a on the first external electrode 14 side, and a first dummy part 16b on the second external electrode 15 side. The dimension, in the X-axis direction, of the first function part 16a is greater than that of the first dummy part 16b.

The second surface electrode 17 is divided, by a gap D formed at a position between its center part in the X-axis direction and the first external electrode 14, into a second function part 17a on the second external electrode 15 side, and a second dummy part 17b on the first external electrode 14 side. The dimension, in the X-axis direction, of the second function part 17a is greater than that of the second dummy part 17b.

The internal electrodes 12, 13 and surface electrodes 16, 17 are formed by a good electrical conductor, respectively. Good electrical conductors by which to form the internal electrodes 12, 13 and surface electrodes 16, 17 include metals such as nickel (Ni), copper (Cu), palladium (Pd), platinum (Pt), silver (Ag), gold (Au), etc., or alloys whose primary component is any of the foregoing, for example.

According to the aforementioned constitution, applying voltage between the first external electrode 14 and the second external electrode 15, of the multilayer piezoelectric element 10, causes voltage to be applied to all ceramic layers 18 in the Z-axis direction. As a result, each ceramic layer 18 contracts in the X-axis direction and therefore the multilayer piezoelectric element 10 as a whole contracts in the X-axis direction.

It should be noted that, of the first surface electrode 16, the first function part 16a connected to the first external electrode 14 can apply voltage to the ceramic layer 18 between it and the second internal electrode 13. On the other hand, the first dummy part 16b connected to the second external electrode 15 cannot apply voltage to the ceramic layer 18 between it and the second internal electrode 13.

In addition, of the second surface electrode 17, the second function part 17a connected to the second external electrode 15 can apply voltage to the ceramic layer 18 between it and the first internal electrode 12. On the other hand, the second dummy part 17b connected to the first external electrode 14 cannot apply voltage to the ceramic layer 18 between it and the first internal electrode 12.

This means that, in the multilayer piezoelectric element 10, the greater the dimension of the function parts 16a, 17a in the X-axis direction, the greater the contraction in the X-axis direction becomes. In the multilayer piezoelectric element 10, therefore, preferably the dimensions of the dummy parts 16b, 17b in the X-axis direction are kept small in order to increase the dimensions of the function parts 16a, 17a in the X-axis direction.

The multilayer piezoelectric element 10 can be widely used as a piezoelectric actuator that operates in the X-axis direction due to the transverse piezoelectric effect. A piezoelectric vibration apparatus is an example of application of the multilayer piezoelectric element 10. The piezoelectric vibration apparatus is typically constituted by combining the multilayer piezoelectric element 10 with a vibration plate formed by a metal.

To be more specific, the piezoelectric vibration apparatus is such that the first principal face 11e side or second principal face 11f side of the multilayer piezoelectric element 10 is adhered to the mounting surface of the vibration plate, for example. The piezoelectric vibration apparatus allows the vibration plate to be vibrated by applying voltage of a prescribed frequency between the external electrodes 14, 15 to expand/contract the multilayer piezoelectric element 10 in the longitudinal direction.

The multilayer piezoelectric element 10 is prone to both end parts in the longitudinal direction bumping against the mounting surface during mounting. In this regard, both end parts of the multilayer piezoelectric element 10 in the longitudinal direction are protected by the external electrodes 14, 15 and thus are not easily damaged. Furthermore, the ridge parts of the external electrodes 14, 15 are shaped as rounded-off faces and thus are not easily chipped, cracked, etc.

In addition, the dummy parts 16b, 17b provided on the surface electrodes 16, 17 facilitate the alignment of the heights of the external electrodes 14, 15 in the Z-axis direction on the principal faces 11e, 11f. In other words, a height difference in the Z-axis direction does not occur easily between the first external electrode 14 and the second external electrode 15. As a result, the multilayer piezoelectric element 10 can reduce listing with respect to the mounting surface.

Furthermore, the multilayer piezoelectric element 10 has a spacing formed between the ceramic base body 11 and the mounting surface because the external electrodes 14, 15 are placed on the principal faces 11e, 11f. This makes the multilayer piezoelectric element 10 less prone to receiving an impact on the ceramic base body 11 from the mounting surface, which reduces damage to the ceramic base body 11.

It should be noted that the constitution of the multilayer piezoelectric element 10 pertaining to this embodiment is not limited to the constitution shown in FIGS. 1 to 3, and can be modified as deemed appropriate. For example, the numbers of internal electrodes 12, 13 or the ceramic layer 18 thickness can be determined in any way as deemed appropriate according to the application, etc., of the multilayer piezoelectric element 10. Additionally, the constitution of the surface electrodes 16, 17 is determined according to the constitution of the internal electrodes 12, 13.

Specifically, when a first internal electrode 12 is placed at the top in the Z-axis direction, the placement of the first function part 16a and first dummy part 16b on the first surface electrode 16, in the X-axis direction, represents a mirror image of the placement in FIG. 2. In other words, the first function part 16a is connected to the second internal electrode 13, while the first dummy part 16b is connected to the first internal electrode 12.

Also, when a second internal electrode 13 is placed at the bottom in the Z-axis direction, the placement of the second function part 17a and second dummy part 17b on the second surface electrode 17, in the X-axis direction, represents a mirror image of the placement in FIG. 2. In other words, the second function part 17a is connected to the first internal electrode 12, while the second dummy part 17b is connected to the second internal electrode 13.

[Method for Manufacturing Multilayer Piezoelectric Element 10]

Figure 4:
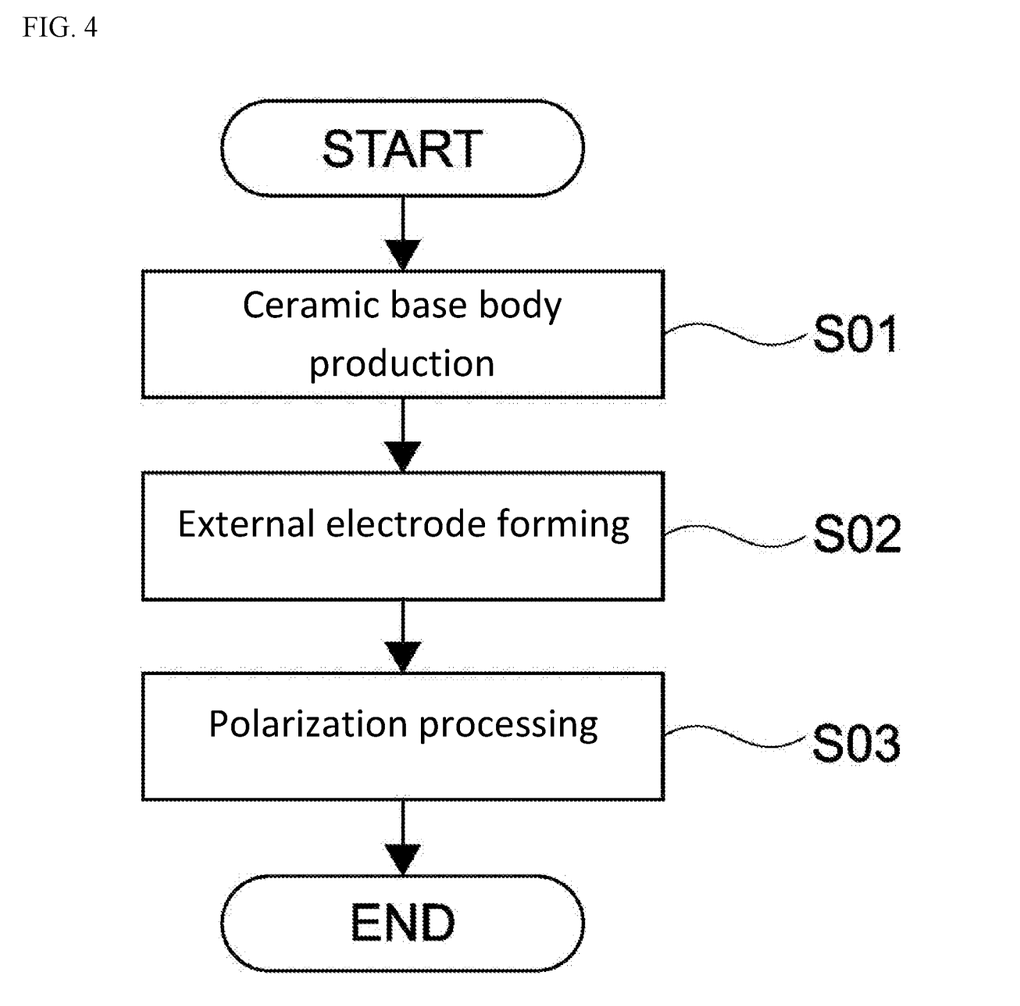
FIG. 4 is a flow chart showing a method for manufacturing the multilayer piezoelectric element.
Figure 5:
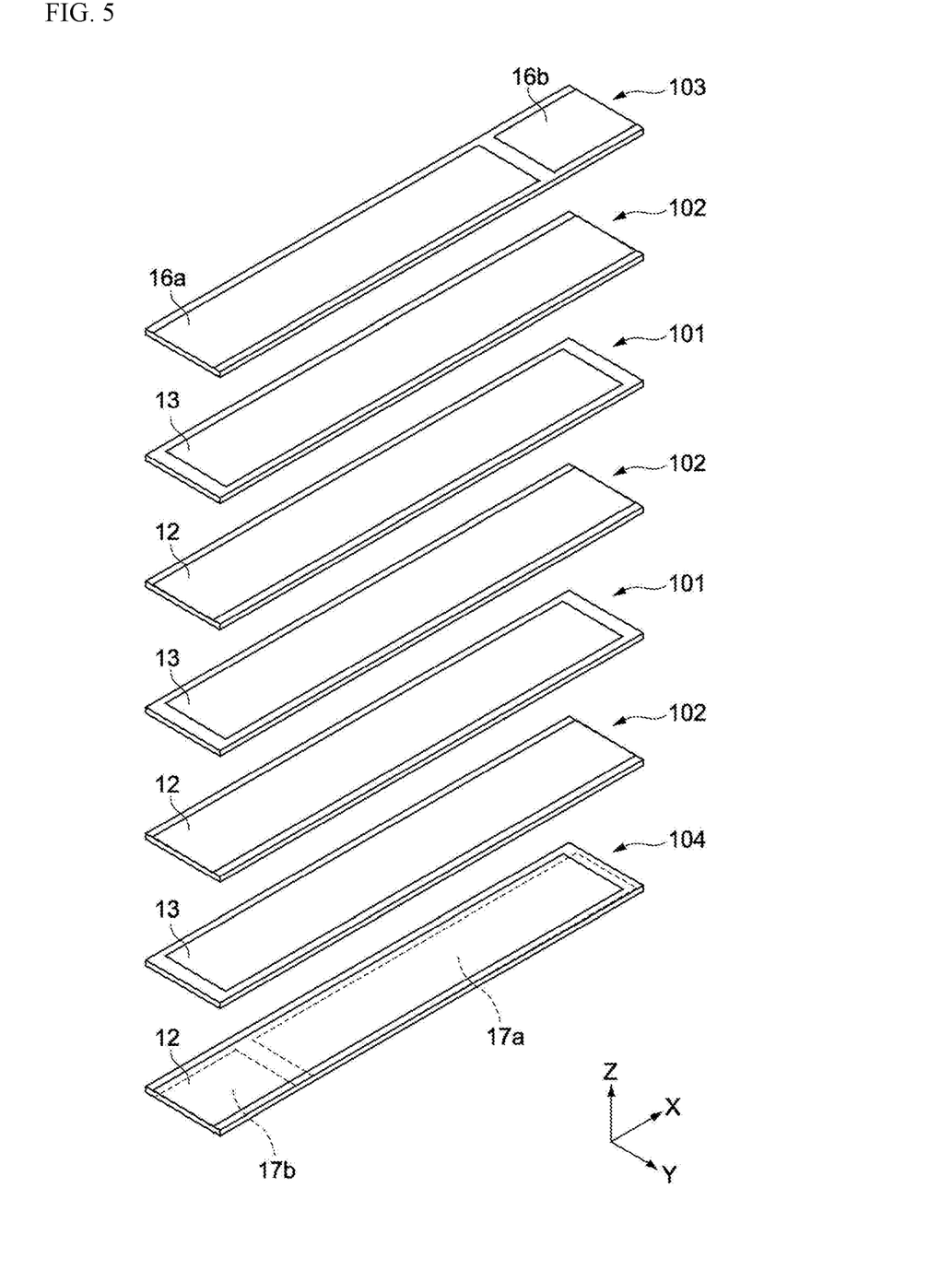
FIG. 5 is a perspective view showing a process for manufacturing the multilayer piezoelectric element.
Figure 6:
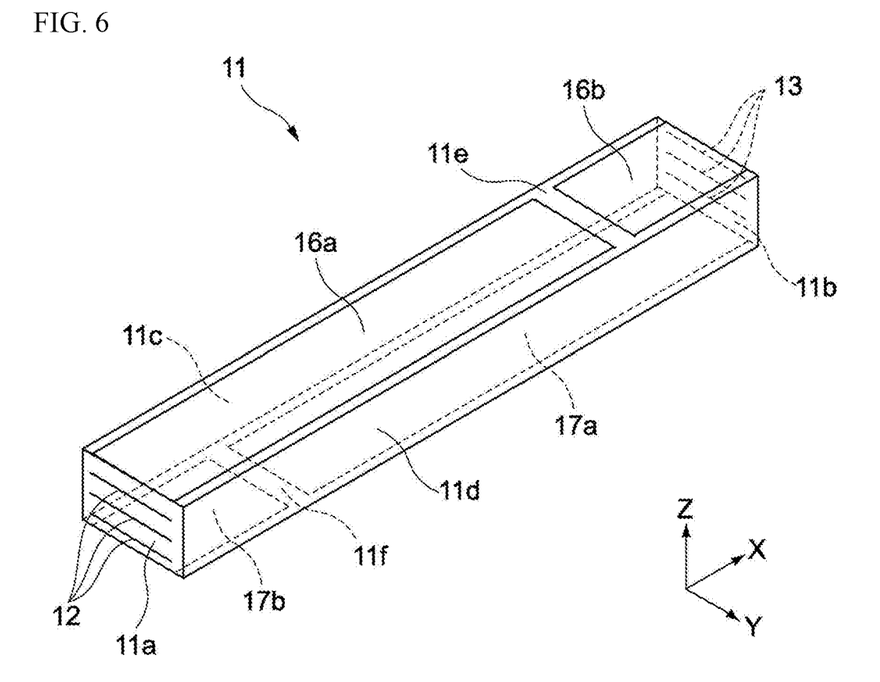
FIG. 6 is a perspective view showing a process for manufacturing the multilayer piezoelectric element.

FIG. 4 is a flow chart showing the method for manufacturing the multilayer piezoelectric element 10. FIGS. 5 and 6 are drawings showing the process for manufacturing the multilayer piezoelectric element 10. The following explains the method for manufacturing the multilayer piezoelectric element 10 according to FIG. 4, by referring to FIGS. 5 and 6 as deemed appropriate.

(Step S01: Ceramic Base Body Production)

In step S01, a ceramic base body 11 is produced. In step S01, first the ceramic sheets 101, 102, 103, 104 shown in FIG. 5 are prepared. The ceramic sheets 101, 102, 103, 104 are piezoelectric green sheets whose primary component is a piezoelectric ceramic.

The piezoelectric green sheets are obtained by forming into sheet shapes a ceramic slurry obtained as a mixture of tentatively sintered piezoelectric ceramic powder, organic polymer binder, and plasticizer. A roll coater, doctor blade, etc., may be used to form the piezoelectric green sheets, for example.

On each of the ceramic sheets 101, 102, 103, 104, a conductive paste is applied in a prescribed pattern, thus forming unsintered internal electrodes 12, 13 and surface electrodes 16, 17. The screen printing method, gravure printing method, etc., may be used to apply the conductive paste, for example.

To be specific, the first internal electrodes 12 are formed on the ceramic sheets 101. The second internal electrodes 13 are formed on the ceramic sheets 102. The first surface electrode 16 is formed on the ceramic sheet 103. The first internal electrode 12 and second surface electrode 17 are formed on the ceramic sheet 104.

In addition, by stacking the ceramic sheets 101, 102, 103, 104 in the Z-axis direction in the order shown in FIG. 5 and then thermally pressure-bonding them, an unsintered ceramic base body 11 is obtained. Uniaxial pressurization, hydrostatic pressurization, etc., may be used to thermally pressure-bond the ceramic sheets 101, 102, 103, 104, for example.

Next, the unsintered ceramic base body 11 is put through binder removal processing by heating it to a temperature between 300 and 500° C., for example. After completing the binder removal processing, the ceramic base body 11 is sintered by heating it to a temperature between 900 and 1200° C., for example. As a result, the ceramic base body 11 shown in FIG. 6 is obtained.

(Step S02: External Electrode Forming)

In step S02, external electrodes 14, 15 are formed on the ceramic base body 11 obtained in step S01, to produce the multilayer piezoelectric element 10 shown in FIGS. 1 to 3. In step S02, the external electrodes 14, 15 may be formed by, for example, applying a conductive paste on both end parts of the ceramic base body 11 in the longitudinal direction and then baking the conductive paste.

The dip coating method may be used to apply the conductive paste, for example. Under the dip coating method, both end parts of the ceramic base body 11 in the X-axis direction are immersed in the conductive paste. As a result, unsintered external electrodes 14, 15 extending from the end faces 11a, 11b along the side faces 11c, 11d, and the principal faces 11e, 11f are formed.

On the ridge parts of the dip-coated external electrodes 14, 15, rounded faces are formed due to the surface tension of the conductive paste. It should be noted that the method for applying the conductive paste is not limited to the dip coating method, and any other known method may be adopted as deemed appropriate. For example, methods for applying the conductive paste, other than the dip coating method, include various printing methods, etc.

In addition, the unsintered external electrodes 14, 15 formed on both end parts of the ceramic base body 11 in the X-axis direction are heated, to bake the external electrodes 14, 15 onto the ceramic base body 11. This sinters the external electrodes 14, 15, and the multilayer piezoelectric element 10 pertaining to this embodiment, as shown in FIGS. 1 to 3, is obtained.

It should be noted that the processing in step S02 may be performed in step S01. For example, the conductive paste may be applied on both end parts of the unsintered ceramic base body 11 in the X-axis direction. This allows the ceramic base body 11 to be sintered, and the external electrodes 14, 15 to be baked, at the same time.

(Step S03: Polarization Processing)

In step S03, the multilayer piezoelectric element 10 is put through polarization processing. To be specific, the polarization processing involves applying a high direct-current electric field oriented in the Z-axis direction, to the multilayer piezoelectric element 10, thereby aligning the direction of the spontaneous polarization of the piezoelectric ceramic constituting the ceramic layers 18. As a result, piezoelectric activity is added to the piezoelectric ceramic and the multilayer piezoelectric element 10 can now demonstrate this function.

[Piezoelectric Vibration Apparatus 20]

The multilayer piezoelectric element 10 can be widely used as a piezoelectric actuator that operates in the X-axis direction due to the transverse piezoelectric effect. A piezoelectric vibration apparatus that generates vibration, is an example of application of the multilayer piezoelectric element 10. The following explains a unimorph-type piezoelectric vibration apparatus 20 constituted with the multilayer piezoelectric element 10.

Figure 7:
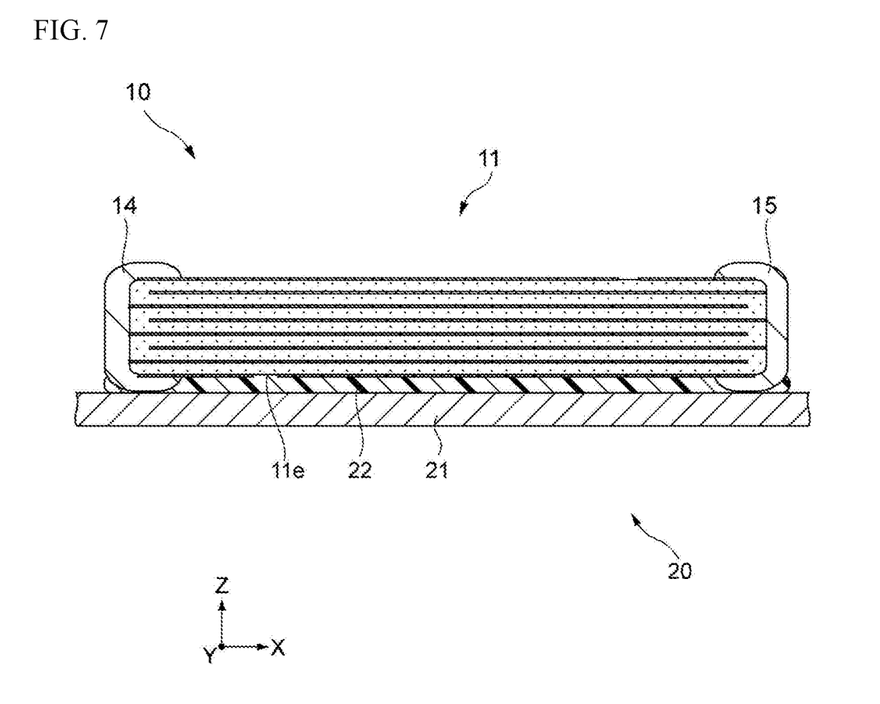
FIG. 7 is a cross-sectional view of a piezoelectric vibration apparatus that uses the multilayer piezoelectric element.

FIG. 7 is a cross-sectional view of the piezoelectric vibration apparatus 20. The piezoelectric vibration apparatus 20 comprises the multilayer piezoelectric element 10, a vibration plate 21, and an adhesive layer 22. The vibration plate 21 is constituted as a flat plate extending along the XY plane, and placed in a manner facing the first principal face 11e of the multilayer piezoelectric element 10. The adhesive layer 22 is placed between the multilayer piezoelectric element 10 and the vibration plate 21.

The vibration plate 21 is formed by metal, glass, etc., for example, and has flexibility in the Z-axis direction. The adhesive layer 22 is formed by a resin material, etc., and joins the multilayer piezoelectric element 10 and the vibration plate 21. The adhesive layer 22 adheres to the bottom part of the multilayer piezoelectric element 10 in the Z-axis direction, and to the top face of the vibration plate 21 in the Z-axis direction.

The adhesive layer 22 is filled between the first principal face 11e of the ceramic base body 11 and the vibration plate 21, and joins the ceramic base body 11 and the vibration plate 21 over a wide area. As a result, the piezoelectric vibration apparatus 20 achieves high joining strength between the multilayer piezoelectric element 10 and the vibration plate 21 via the adhesive layer 22.

In the piezoelectric vibration apparatus 20, the high joining strength between the multilayer piezoelectric element 10 and the vibration plate 21 due to the adhesive layer 22 prevents the multilayer piezoelectric element 10 from easily separating from the vibration plate 21, even when the multilayer piezoelectric element 10 is caused to expand/contract greatly. Because of this, the piezoelectric vibration apparatus 20 maintains a large displacement or amplitude of the vibration plate 21.

[Electronic Device 30]

Figure 8A:
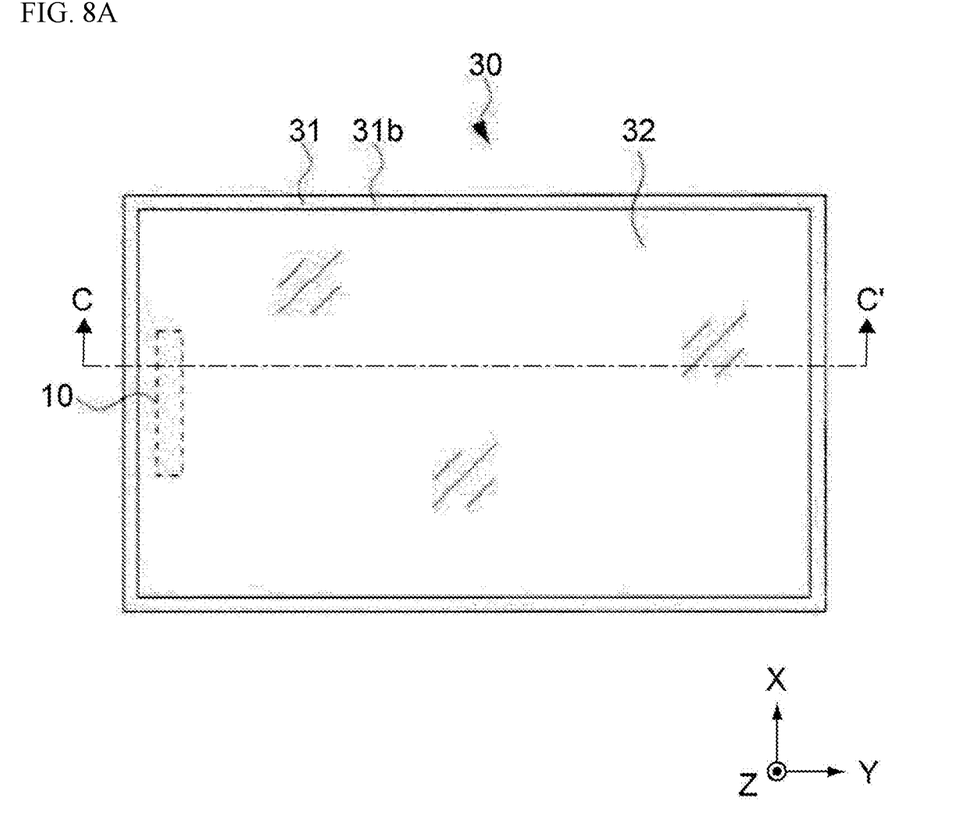
FIG. 8A is a plan view of an electronic device that uses the multilayer piezoelectric element.
Figure 8B:
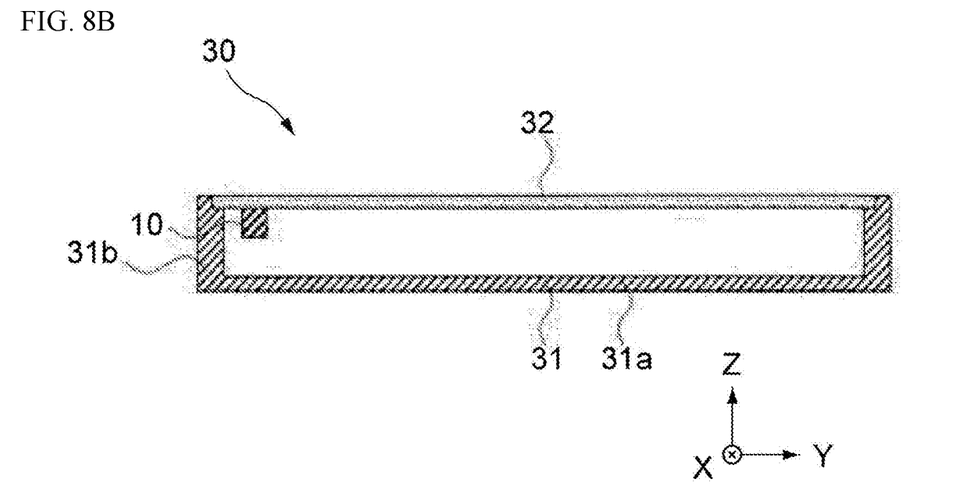
FIG. 8B is a cross-sectional view of the electronic device along line C-C' in FIG. 8A.

FIGS. 8A and 8B are drawings showing schematic representations of an electronic device 30 that uses the multilayer piezoelectric element 10. FIG. 8A is a plan view of the electronic device 30. FIG. 8B is a cross-sectional view of the electronic device 30 along line C-C' in FIG. 8A. The electronic device 30 is constituted as a multifunctional mobile communication terminal generally referred to as a "smartphone."

The electronic device 30 has the multilayer piezoelectric element 10, a housing 31, and a panel 32. The housing 31 has a bottom plate 31a extending rectangularly along the XY plane and a frame body 31b extending from the periphery of the bottom plate 31a upward in the Z-axis direction, and is formed as a box shape that opens upward in the Z-axis direction. The panel 32 extends rectangularly along the XY plane and closes the housing 31 from above in the Z-axis direction.

The housing 31 encloses each constitution (not illustrated) of circuit boards, electronic components, etc., for achieving the various functions of the electronic device 30. The panel 32 is constituted as a touch panel. In other words, the panel 32 provides both an image display function to display images and an input function to detect input operations performed by the user using a finger, etc.

It should be noted that the panel 32 is not limited to a touch panel, and it need not have the constitution described above, either. For example, the panel 32 may be a touch pad that does not have an image display function, but has only an input function. Also, the panel 32 may be a protective panel that protects a touch panel provided separately as part of the electronic device 30.

The multilayer piezoelectric element 10 is adhered to the bottom face of the panel 32 in the Z-axis direction and faces the bottom plate 31a inside the housing 31. The position of the multilayer piezoelectric element 10 on the bottom face of the panel 32 in the Z-axis direction can be determined in any way as desired. In the electronic device 30, the panel 32 fulfills the function the vibration plate 21 provides in the piezoelectric vibration apparatus 20 shown in FIG. 7.

To be specific, the electronic device 30 allows the panel 32 to vibrate as a result of the multilayer piezoelectric element 10 extending/contracting in the X-axis direction. For this reason, preferably the panel 32 is made primarily of a glass, acrylic resin,\ or other material that can vibrate in a favorable manner. Also, the adhesive layer that adheres the multilayer piezoelectric element 10 and the panel 32 is constituted in the same way as the adhesive layer 22 in the piezoelectric vibration apparatus 20.

The electronic device 30 can generate sound via air conduction, bone conduction, etc., by vibrating the panel 32, to provide sound information to the user. Also, the electronic device 30 can vibrate the panel 32 to, for example, present haptic sensations to the user who performs input operations on the panel 32.

It should be noted that, while the top face of the panel 32 in the Z-axis direction is typically a flat surface, it may also be a curved surface, etc., for example. In addition, the electronic device 30 is not limited to a smartphone, and it may also be constituted as a tablet terminal, notebook personal computer, mobile phone, watch, photo stand, or a remote control or operating part, etc., of various types of devices.

Other Embodiments

The foregoing explained an embodiment of the present invention, but it goes without saying that the present invention is not limited to the aforementioned embodiment and various modifications can be added. As an example of such other embodiment, the multilayer piezoelectric element 10 pertaining to a variation example of the aforementioned embodiment is explained.

Figure 9:
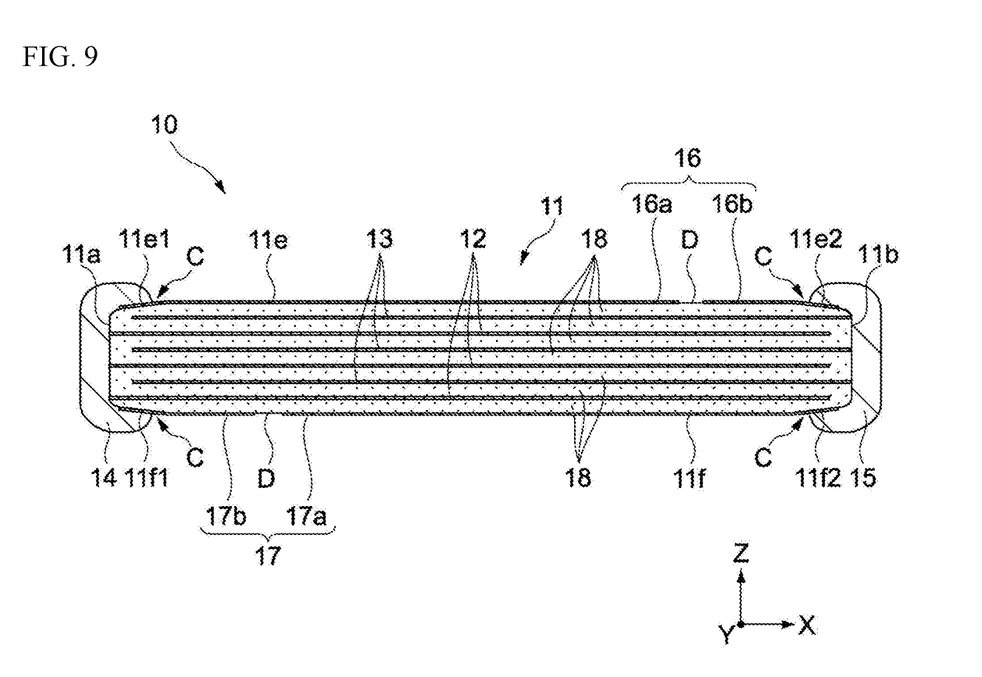
FIG. 9 is a perspective view of a variation example of the multilayer piezoelectric element.

FIG. 9 is a cross-sectional view of the multilayer piezoelectric element 10 pertaining to a variation example of the aforementioned embodiment. The multilayer piezoelectric element 10 pertaining to the variation example has first angled faces 11e1, 11e2 provided at both end parts of the first principal face 11e in the X-axis direction, and second angled faces 11f1, 11f2 provided at both end parts of the second principal face 11f in the X-axis direction.

The first angled faces 11e1, 11e2 provided at both end parts of the first principal face 11e in the X-axis direction taper downward in the Z-axis direction toward the end faces 11a, 11b. The second angled faces 11f1, 11f2 provided at both end parts of the second principal face 11f in the X-axis direction taper upward in the Z-axis direction toward the end faces 11a, 11b.

The first external electrode 14 extends from the first end face 11a of the ceramic base body 11 to middle of the angled faces 11e1, 11f1, and covers parts of the angled faces 11e1, 11f1. Also, the second external electrode 15 extends from the second end face 11b of the ceramic base body 11 to middle of the angled faces 11e2, 11f2, and covers parts of the angled faces 11e2, 11f2.

Accordingly, the areas of the angled faces 11e1, 11e2, 11f1, 11f2 on the inner side in the X-axis direction are not covered by the external electrodes 14, 15. As a result, groove parts C whose outer side in the X-axis direction is separated by the external electrodes 14, 15 are formed on the angled faces 11e1, 11e2, 11f1, 11f2. Each groove part C concaves in the Z-axis direction and extends along the Y-axis direction.

The multilayer piezoelectric element 10 pertaining to the variation example is such that, when either its first principal face 11e side or second principal face 11f side is adhered to the mounting surface of a vibration plate (such as the vibration plate 21 shown in FIG. 7), etc., using an adhesive, the adhesive is filled in the groove parts C. This means that, with the multilayer piezoelectric element 10, the strength of adhesion to the mounting surface due to the adhesive improves and therefore high adhesive property with respect to the mounting surface can be achieved.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-139413, filed Jul. 18, 2017, and No. 2018-045560, filed Mar. 13, 2018, each disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A multilayer piezoelectric element, comprising:
   a ceramic base body formed by a piezoelectric ceramic and having a pair of end faces that are facing each other in a longitudinal direction, a pair of principal faces that are facing each other in a thickness direction crossing at right angles with the longitudinal direction, and a pair of side faces that are facing each other in a width direction crossing at right angles with the longitudinal direction and the thickness direction;
   a pair of external electrodes covering the pair of end faces and extending from the pair of end faces along the pair of principal faces and the pair of side faces;
   multiple internal electrodes stacked inside the ceramic base body along the thickness direction and connected alternately to the pair of external electrodes along the thickness direction; and
   first and second surface electrodes extending from the pair of external electrodes along the pair of principal faces, respectively,
   wherein the first surface electrode is divided on a first principal face, which is one of the pair of principal faces, in the longitudinal direction into longer and shorter sections separated at a first position closer to one of the external electrodes to which the internal electrode immediately adjacent to the first surface electrode in the thickness direction is connected, than to the other external electrode, so that the longer section of the first surface electrode extends from the other external electrode to the first position closer to the one of the external electrode, and
   the second surface electrode is divided on a second principal face, which is the other of the pair of principal faces, in the longitudinal direction into longer and shorter sections separated at a second position closer to one of the external electrodes to which the internal electrode immediately adjacent to the second surface electrode in the thickness direction is connected, than to the other external electrode, so that the longer section of the second surface electrode extends from the other external electrode to the second position closer to the one of the external electrode.

2. The multilayer piezoelectric element according to claim 1, wherein the first and second positions where the first and second surface electrodes are divided, respectively, are near the respective external electrodes.

3. The multilayer piezoelectric element according to claim 1, wherein round-chamfered faces are formed along ridge parts of the pair of external electrodes.

4. The multilayer piezoelectric element according to claim 3, wherein radii of curvature of the round chamfered faces are 10 µm or greater.

5. The multilayer piezoelectric element according to claim 1, wherein:
   angled faces tapering inward in the thickness direction toward the pair of end faces are provided at both end parts of the pair of principal faces in the longitudinal direction; and
   the pair of external electrodes cover parts of the angled faces.

6. A piezoelectric vibration apparatus, comprising:
   the multilayer piezoelectric element according to claim 1;
   a vibration plate facing the multilayer piezoelectric element in the thickness direction; and
   an adhesive layer placed between the multilayer piezoelectric element and the vibration plate.

7. A piezoelectric vibration apparatus, comprising:
   the multilayer piezoelectric element according to claim 2;
   a vibration plate facing the multilayer piezoelectric element in the thickness direction; and
   an adhesive layer placed between the multilayer piezoelectric element and the vibration plate.

8. A piezoelectric vibration apparatus, comprising:
   the multilayer piezoelectric element according to claim 3;
   a vibration plate facing the multilayer piezoelectric element in the thickness direction; and
   an adhesive layer placed between the multilayer piezoelectric element and the vibration plate.

9. A piezoelectric vibration apparatus, comprising:
   the multilayer piezoelectric element according to claim 4;
   a vibration plate facing the multilayer piezoelectric element in the thickness direction; and
   an adhesive layer placed between the multilayer piezoelectric element and the vibration plate.

10. A piezoelectric vibration apparatus, comprising:
    the multilayer piezoelectric element according to claim 5;
    a vibration plate facing the multilayer piezoelectric element in the thickness direction; and
    an adhesive layer placed between the multilayer piezoelectric element and the vibration plate.

11. An electronic device, comprising:
    the multilayer piezoelectric element according to claim 1;
    a panel having the multilayer piezoelectric element adhered to it in a manner facing the panel in the thickness direction; and
    a housing retaining the panel.

12. An electronic device, comprising:
    the multilayer piezoelectric element according to claim 2;
    a panel having the multilayer piezoelectric element adhered to it in a manner facing the panel in the thickness direction; and
    a housing retaining the panel.

13. An electronic device, comprising:
    the multilayer piezoelectric element according to claim 3;
    a panel having the multilayer piezoelectric element adhered to it in a manner facing the panel in the thickness direction; and
    a housing retaining the panel.

14. An electronic device, comprising:
    the multilayer piezoelectric element according to claim 4;
    a panel having the multilayer piezoelectric element adhered to it in a manner facing the panel in the thickness direction; and
    a housing retaining the panel.

15. An electronic device, comprising:
    the multilayer piezoelectric element according to claim 5;

a panel having the multilayer piezoelectric element adhered to it in a manner facing the panel in the thickness direction; and a housing retaining the panel.

* * * * *